United States Patent [19]
Ratia, Jr.

[11] Patent Number: 6,029,330
[45] Date of Patent: Feb. 29, 2000

[54] TOOL FOR COMPRESSING A TORSIONAL SPRING FOR CLAMPING A HEAT SINK

[75] Inventor: Bertel R. Ratia, Jr., Ft. Collins, Colo.

[73] Assignee: Hewlett-Packard Company, Palo Alto, Calif.

[21] Appl. No.: 08/936,976

[22] Filed: Sep. 25, 1997

[51] Int. Cl.[7] ...................................................... B23P 19/02
[52] U.S. Cl. ................................................ 29/235; 29/268
[58] Field of Search .............................. 29/235, 268, 225, 29/228, 238, 6; 81/418, 419, 420, 424.5, 426

[56] References Cited

U.S. PATENT DOCUMENTS

| | | |
|---|---|---|
| D. 312,199 | 11/1990 | Dlugolecki . |
| 3,038,703 | 6/1962 | Deakin et al. . |
| 3,602,971 | 9/1971 | Halstead . |
| 4,089,513 | 5/1978 | Mack . |
| 4,673,174 | 6/1987 | Tabbert . |
| 4,679,118 | 7/1987 | Johnson et al. . |
| 4,745,456 | 5/1988 | Clemens . |
| 4,747,588 | 5/1988 | Dillhoff . |
| 4,756,078 | 7/1988 | Dougherty . |
| 4,821,610 | 4/1989 | Redmon, Jr. et al. . |
| 4,873,761 | 10/1989 | Korsunsky . |
| 4,919,021 | 4/1990 | Franks . |
| 4,944,204 | 7/1990 | West . |
| 5,052,474 | 10/1991 | Bronnert . |
| 5,099,550 | 3/1992 | Beane et al. . |
| 5,208,731 | 5/1993 | Blomquist . |
| 5,280,409 | 1/1994 | Selna et al. . |
| 5,287,249 | 2/1994 | Chen . |
| 5,304,735 | 4/1994 | Earl et al. . |
| 5,307,239 | 4/1994 | McCarty et al. . |
| 5,323,845 | 6/1994 | Kin-shon . |
| 5,357,404 | 10/1994 | Bright et al. . |
| 5,381,305 | 1/1995 | Harmon et al. . |
| 5,386,338 | 1/1995 | Jordan et al. . |
| 5,396,402 | 3/1995 | Perugini et al. . |
| 5,423,375 | 6/1995 | Chiou . |
| 5,486,981 | 1/1996 | Blomquist . |
| 5,615,735 | 4/1997 | Yoshida et al. . |
| 5,697,134 | 12/1997 | Spaulding . |

FOREIGN PATENT DOCUMENTS

| | | |
|---|---|---|
| 402119250A | 5/1990 | Japan . |
| 405191071A | 7/1993 | Japan . |

OTHER PUBLICATIONS

New Heatsink Spring Clip For Use With AMP* Low Insertion Force PGA Sockets, Apr. 1993, Thermalloy, Inc.

*Primary Examiner*—David A. Scherbel
*Assistant Examiner*—Daniel G. Shanley
*Attorney, Agent, or Firm*—Jack A. Lenell

[57] ABSTRACT

A tool for compressing a torsional spring for clamping a heat sink. The tool includes a base having an aperture extending therein for receiving the torsional spring and the heat sink. A first set of opposing jaws is pivotally coupled with the base for compressing the torsional spring in a vertical direction. A second set of opposing jaws is pivotally coupled with the base for compressing the torsional spring in a horizontal direction.

9 Claims, 8 Drawing Sheets

TOOL FOR COMPRESSING A TORSIONAL SPRING FOR CLAMPING A HEAT SINK

FIELD OF THE INVENTION

The invention is generally directed to the field of tools for electronic assembly, and is more particularly directed to the field of heat sink clamping and assembly.

BACKGROUND OF THE INVENTION

Typically heat sinks are mounted to an outer surface of an integrated circuit (I.C.) package to facilitate the dissipation of heat from the integrated circuit contained within the package. Most heat sinks are thermally conductive and have a plurality of extruded fins to provide a large surface area, which allows heat to be more efficiently dissipated by natural or forced convection. To provide for efficient heat transfer from the I.C. package to the heat sink, spring clamps are used to press the heat sink in close contact with the I.C. package.

There are a variety of methods known to attach heat sinks to packages by means of spring clamps. One such method employing a torsional spring for clamping the heat sink is described in U.S. Pat. No. 5,615,735 issued Apr. 1, 1997 to Yoshida et al. While such torsional spring provide an inexpensive, low-profile means for heat sink clamping, an efficient and compact tool for compressing the torsional spring is needed.

SUMMARY OF THE INVENTION

The present invention provides an efficient and compact tool for compressing a torsional spring for clamping a heat sink.

Briefly and in general terms the tool includes a base having an aperture extending therein for receiving the torsional spring and the heat sink. A first set of opposing jaws is pivotally coupled with the base for compressing the torsional spring in a vertical direction. A second set of opposing jaws is pivotally coupled with the base for compressing the torsional spring in a horizontal direction. The first set of jaws is arranged orthogonal to the second set of jaws, so as to provide an efficient and compact arrangement of the tool.

Each member of the first set of jaws has a respective L shaped extremity for engaging and retaining the heat sink, which in turn engages a central region of the torsional spring so as to support compressing the torsional spring in the vertical direction. Each member of the second set of jaws has a respective jaw extremity having a respective trough floor for engaging a respective opposing extremity of the torsional spring, so as to further support compressing the torsional spring in the vertical direction. Each member of the second set of jaws has a respective extremity has a respective trough wall for engaging a respective opposing extremity of the torsional spring, and for compressing the torsional spring in the horizontal direction.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
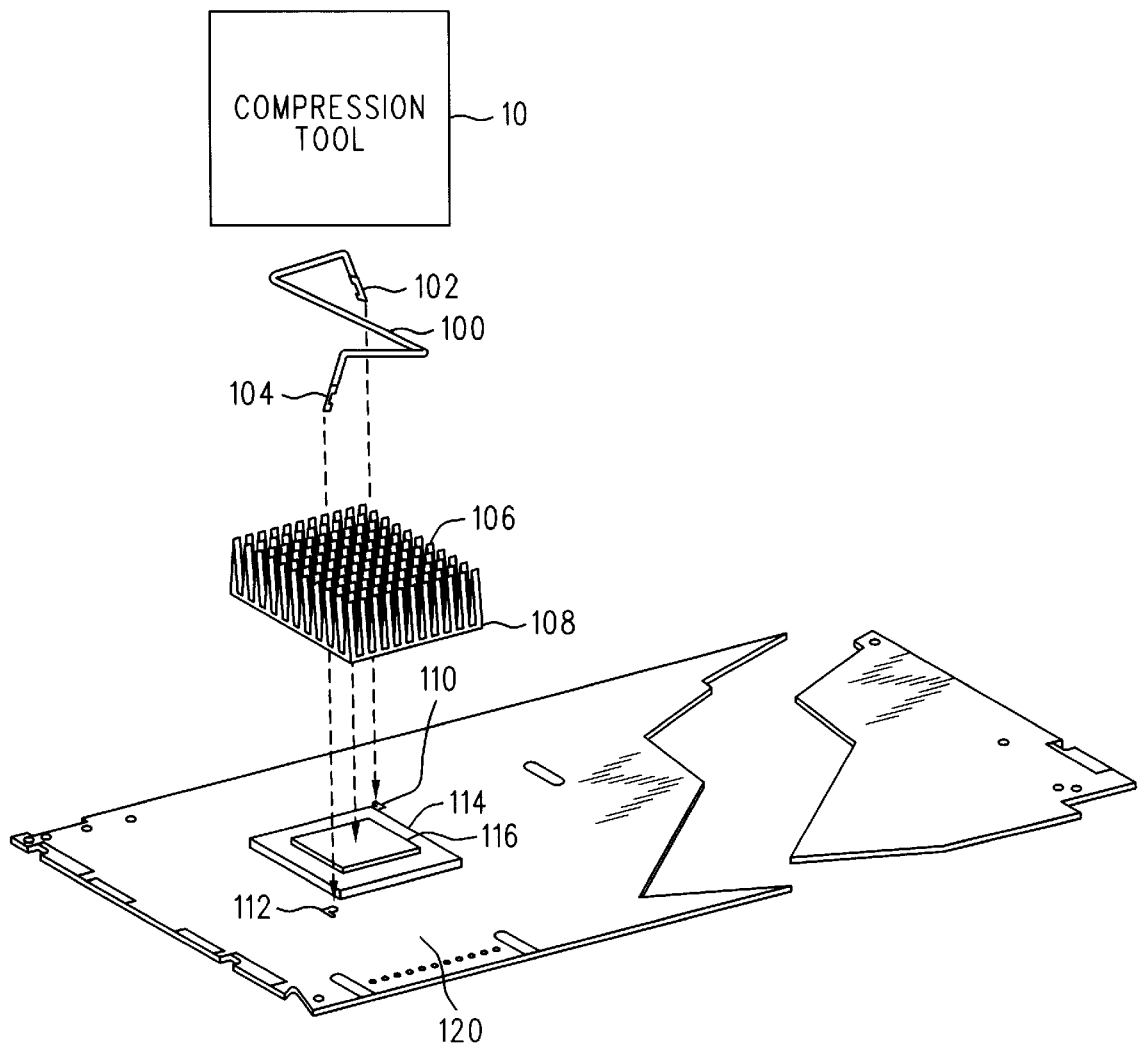
FIG. 1 is a partial top perspective exploded view of a heat sink assembly shown with a compression tool of the invention.

FIG. 1 is a partial top perspective exploded view of a heat sink assembly shown with a compression tool of the invention as a functional block 10. A torsional spring 100 with notched feet 102 and 104 is inserted into a groove between fins 106 of heat sink 108 for clamping the heat sink. The torsional spring is coupled to printed circuit board 120 by compressing the torsional spring using the compression tool of the invention and inserting notched feet 102 and 104 of the torsional spring into L-shaped holes 110 and 112 in printed circuit (P.C.) board 120. When the compression tool releases compression of the torsional spring, the torsional spring expands to clamp the heat sink 108 on top of the I.C. package 114 or preferably a heat spreader 116, which are sandwiched between the heat sink 108 and the P.C. board.

The torsional spring 100 can be made of any elastic spring material, such as hardened spring steel wire. In one example, the torsional spring 100 is made of 302 stainless steel wire.

Figure 2:
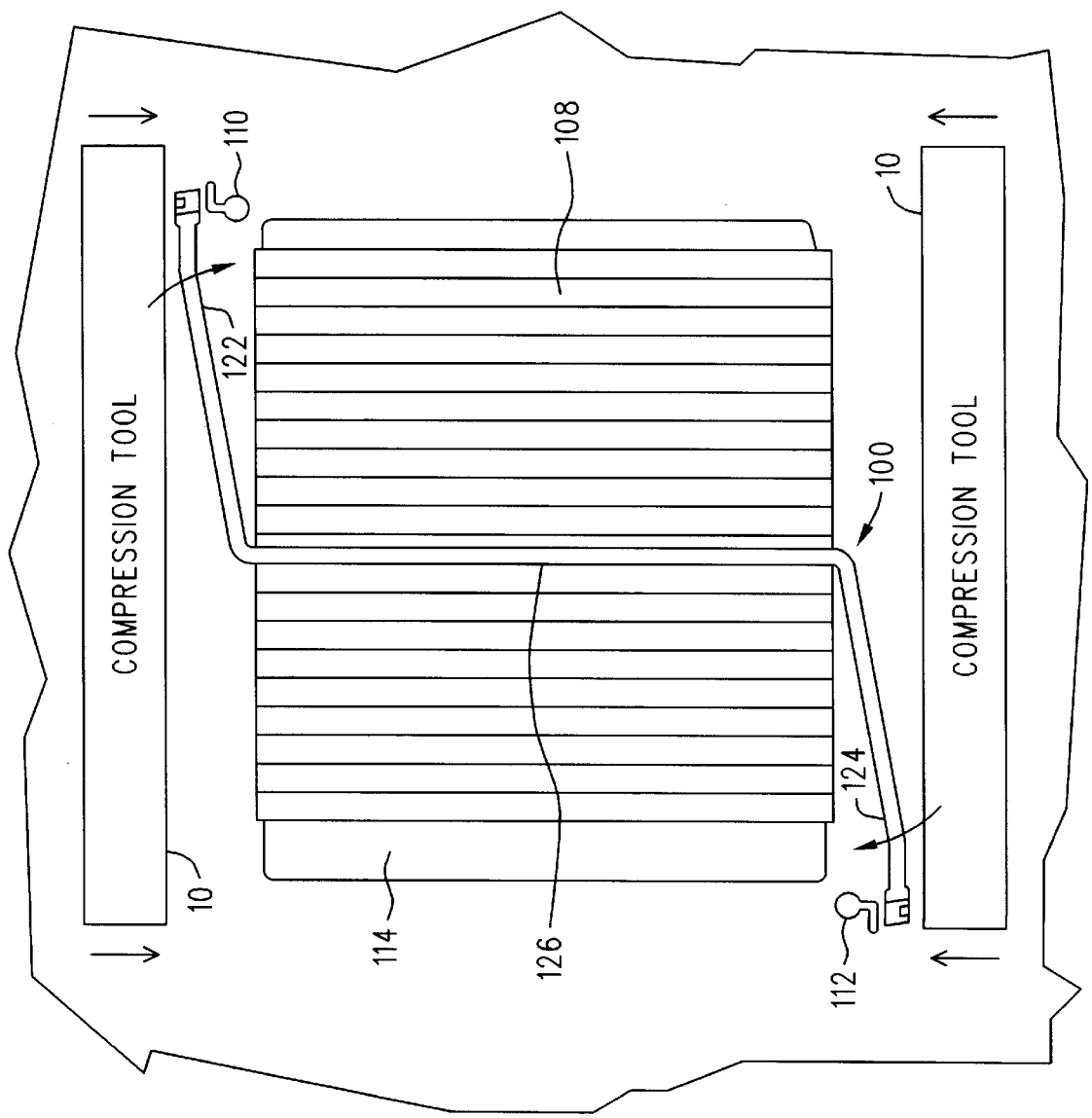
FIG. 2 shows a partial top view of torsional spring in conjunction with the compression tool of the invention.

FIG. 2 shows a partial top view of torsional spring 100 whereby torsional spring 100 forms a Z-shaped pattern. Extremities 122 and 124 of the torsional spring are bent slightly past 90 degrees from central region 126 such that extremities 122 and 124 are bent slightly in the direction of notched feet 102 and 104, respectively. This Z shape creates a load such that when extremities 122 and 124 are engaged by the compression tool 10, and the torsional spring 100 is compressed by the compression tool in a horizontal direction as shown, and then released once notched feet 102 and 104 are inside holes 110 and 112 (see FIG. 2), notched feet 102 and 104 lock to an outer edge of holes 110 and 112 in P.C. board 120.

Figure 3:
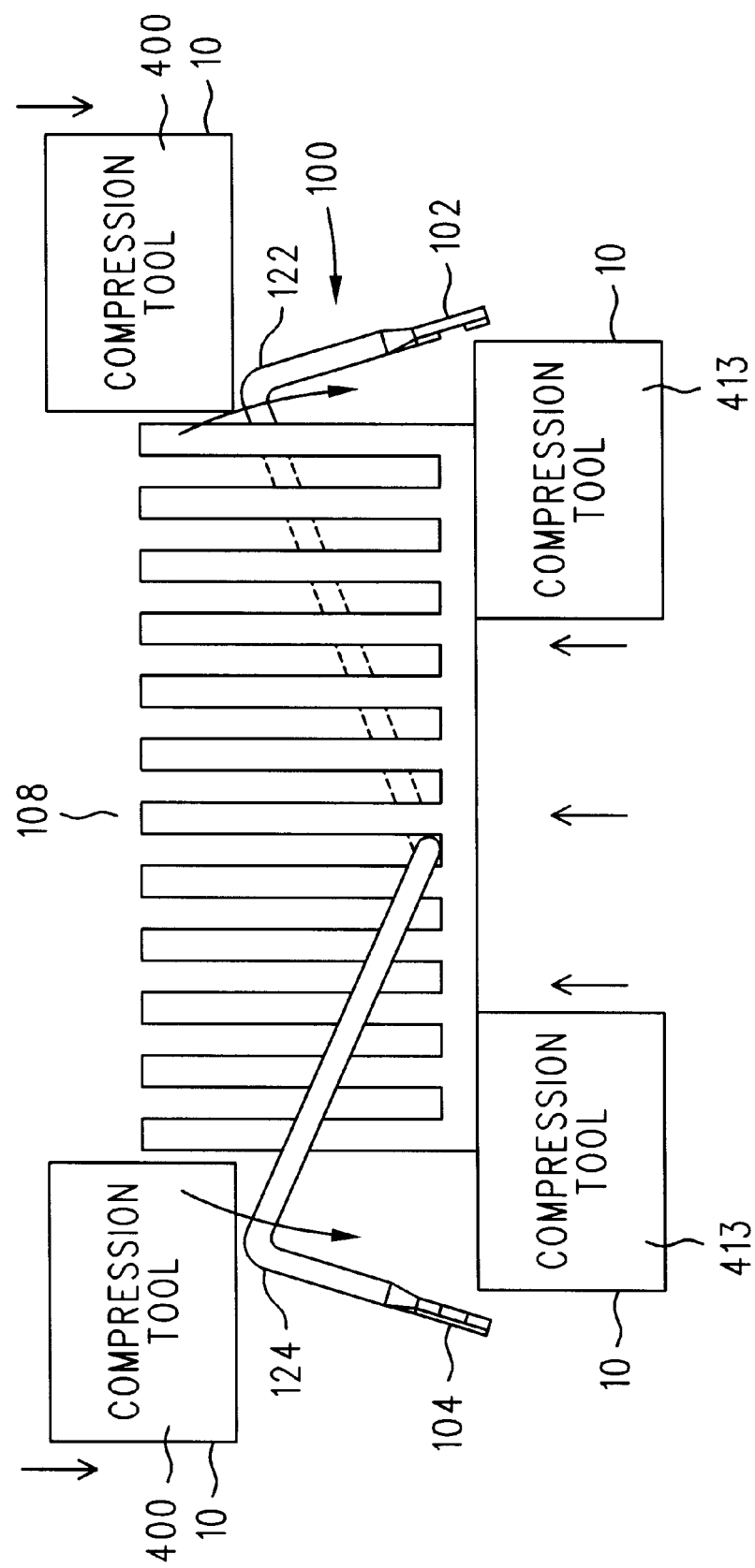
FIG. 3 shows a partial end view of torsional spring in conjunction with the compression tool of the invention.

FIG. 3 shows a partial end view of torsional spring 100 whereby torsional spring 100 forms an M-shaped pattern. In this direction, extremities 122 and 124 are bent a few degrees less than 180 degrees with respect to a central region of the torsional spring. This M-shape creates a load such that when extremities 122 and 124 are engaged by the compression tool 10, and the torsional spring 100 is compressed by the compression tool in a vertical direction and then released once notched feet 102 and 104 are locked in the holes in the P.C. board, heat sink 108 is clamped securely in place on top of the I.C. package by the torsional spring. As shown in FIG. 3, the compression tool engages and retains the heat sink, which in turn engages the central region of the torsional spring so as to further support compressing the torsional spring in the vertical direction.

From the foregoing, it should be understood that the Z-M shaped torsional spring 100 acts as a torsional spring in both the vertical and horizontal directions. The assembly is self-correcting in that the spring force of torsional spring 100 will force the heat sink into a stable position if the heat sink is slightly displaced.

Figure 4A:
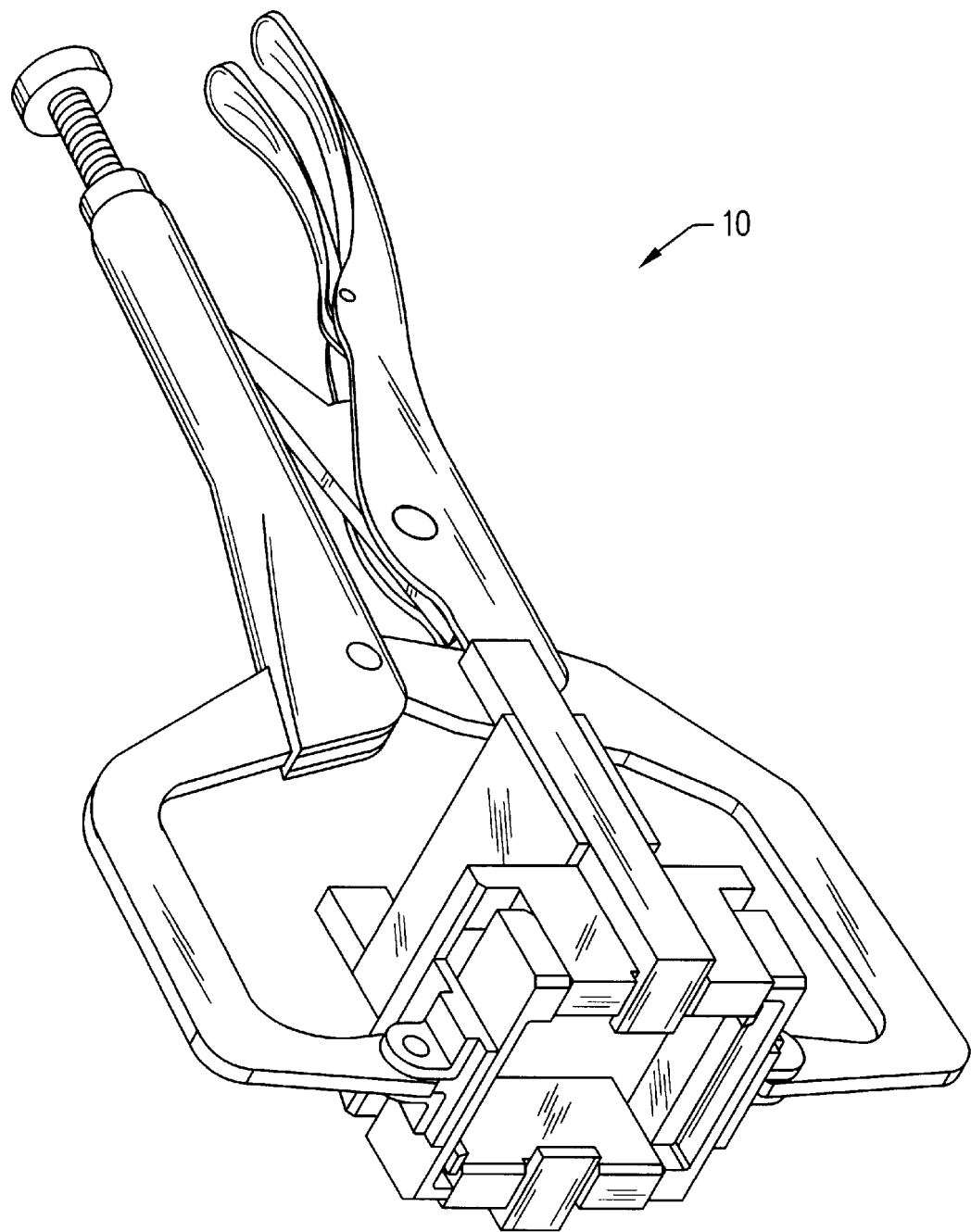
FIGS. 4A through 4C show perspective view of the preferred embodiment of the compression tool of the invention.
Figure 4B:
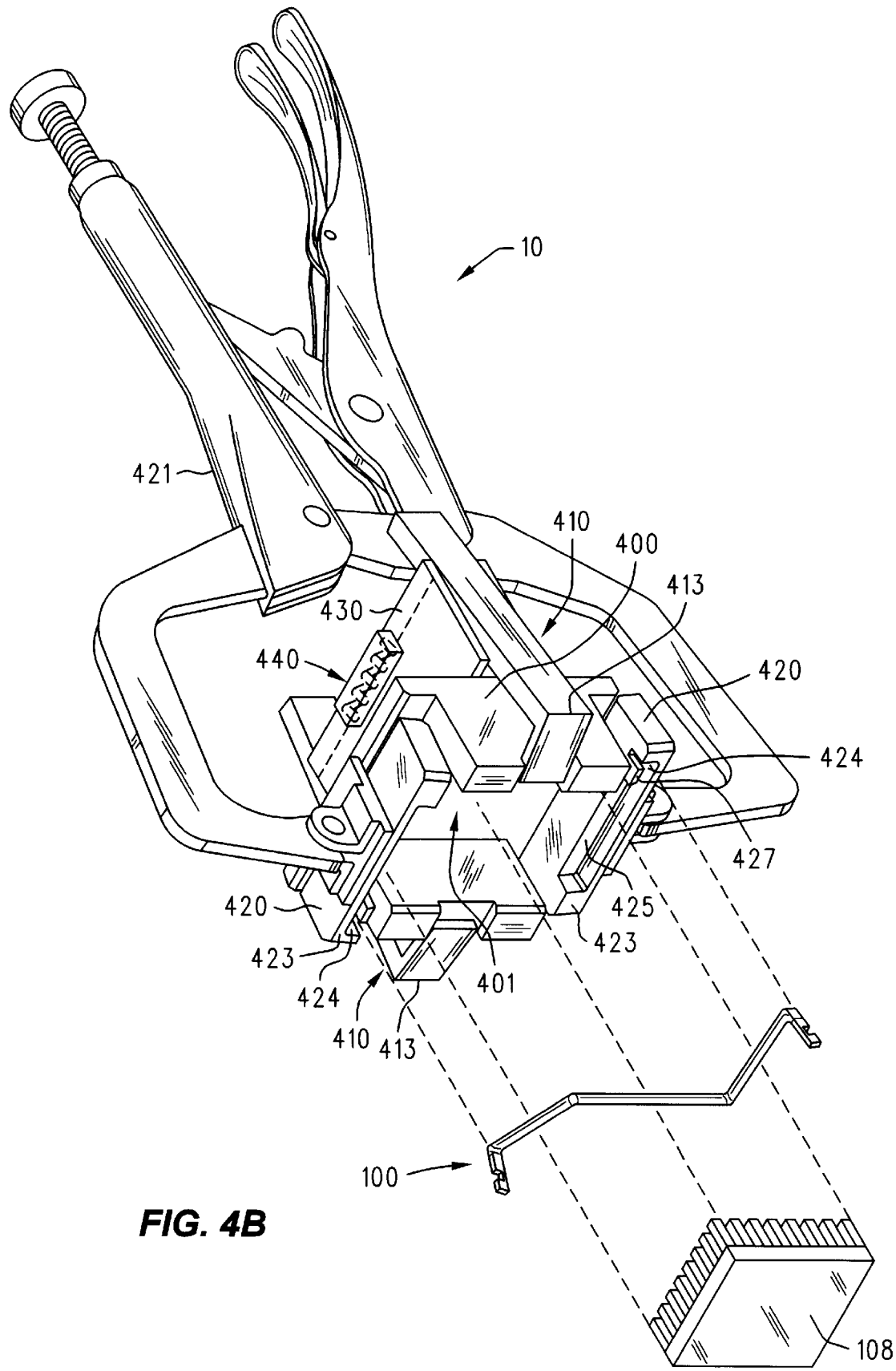

FIG. 4A is a perspective view of a preferred embodiment of the compression tool 10 of the invention. FIG. 4B is another perspective view of the preferred embodiment of the compression tool 10 of the invention. As shown in FIG. 4B, the compression tool 10 includes a base 400 having an aperture 401 extending therein for receiving the torsional spring 100 and the heat sink 108.

A first set of opposing jaws 410 is pivotally coupled with the base for compressing the torsional spring in the vertical direction. In the preferred embodiment a coiled spring is coupled to the first set of jaws for forcing the first set of jaws closed.

A second set of opposing jaws 420 is pivotally coupled with the base for compressing the torsional spring in the horizontal direction. In the preferred embodiment, a locking pliers 421 is coupled with the second set of jaws for controlling the second set of jaws. The first set of jaws 410 is arranged orthogonal to the second set of jaws 420, so as to provide an efficient and compact arrangement of the compression tool.

Each member of the first set of jaws 410 has a respective L shaped extremity 413 for engaging and retaining the heat sink 108, which in turn engages a central region of the torsional spring so as to support compressing the torsional spring in the vertical direction. Each member of the second set of jaws 420 has a respective jaw extremity 423 having a respective trough 424, and in particular having a respective trough floor 425 for engaging a respective opposing extremity of the torsional spring, so as to further support compressing the torsional spring in the vertical direction. The respective jaw extremity 423 of each member of the second set of jaws has a respective vertical post 427 extending from the trough floor for retaining the extremity of the torsional spring as the trough floor supports compressing the torsional spring in the vertical direction.

Figure 4C:
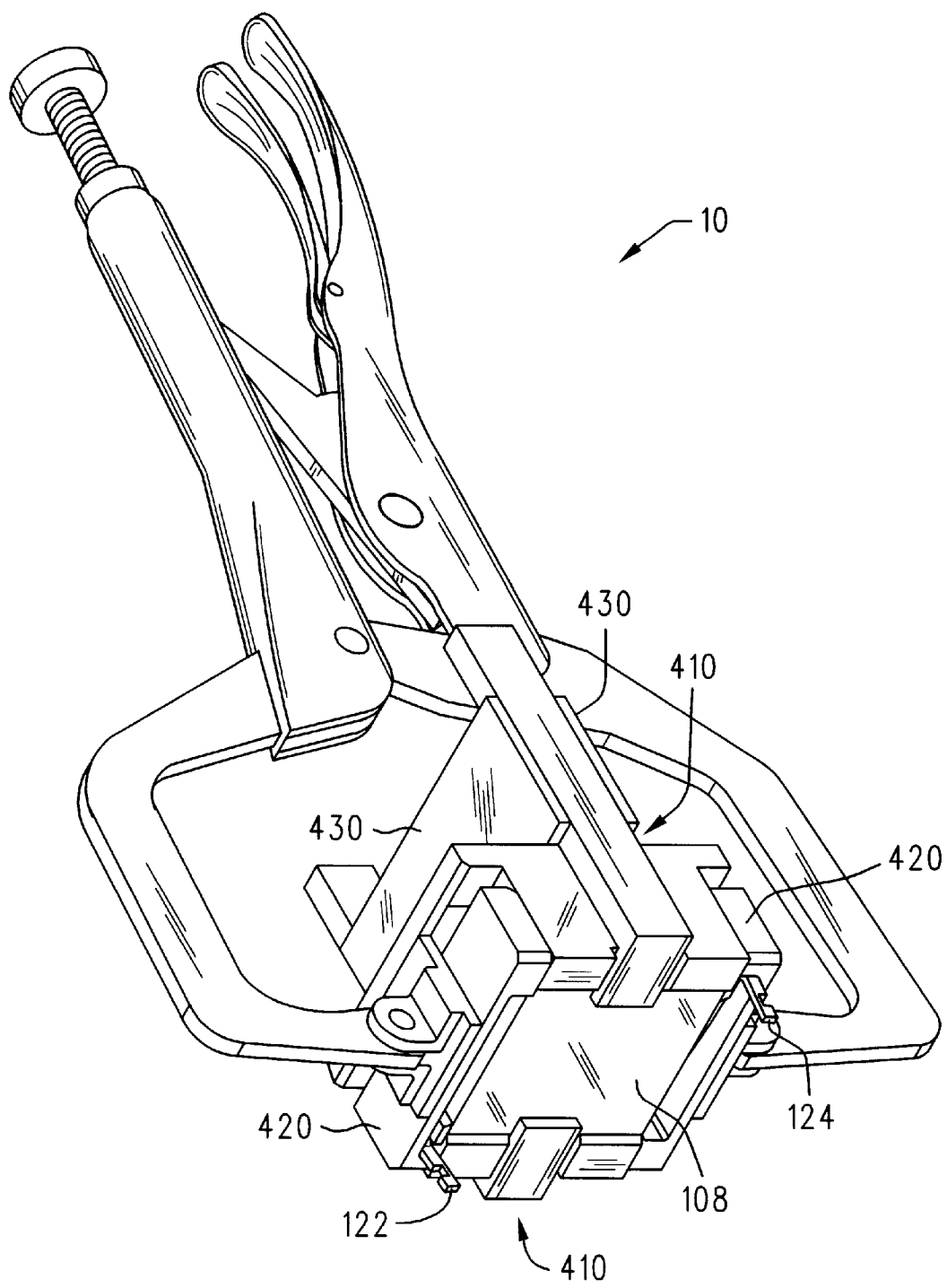

It should be noted that in FIG. 4B the first and second set of jaws are shown as pivoted open for receiving the torsional spring and heat sink. FIG. 4C is another perspective view of the preferred embodiment of the compression tool 10 of the invention. In FIG. 4C, the torsional spring and the heat sink are shown disposed in the aperture of the base, and the first and second set of jaws 410, 420 are shown as pivoted closed, compressing the torsional spring in both the vertical and horizontal directions. Extremities of the first and second set of jaws are sufficiently short so that the at least a portion of extremities 122, 124 of the torsional spring extend beyond the extremities of the jaws when the torsional spring and the heat sink are disposed in the aperture of the base, so as to provide for ease of inserting the notched feet of the torsional spring into the L shaped holes of the P.C. board, as discussed previously herein.

Figure 5A:
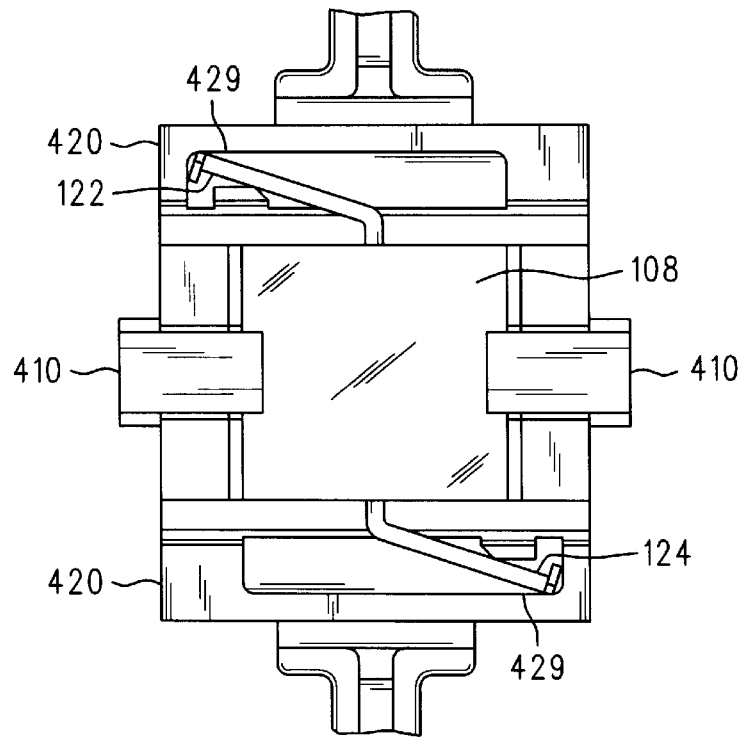
FIGS. 5A through 5C show bottom views of the preferred embodiment of the compression tool of the invention.
Figure 5B:
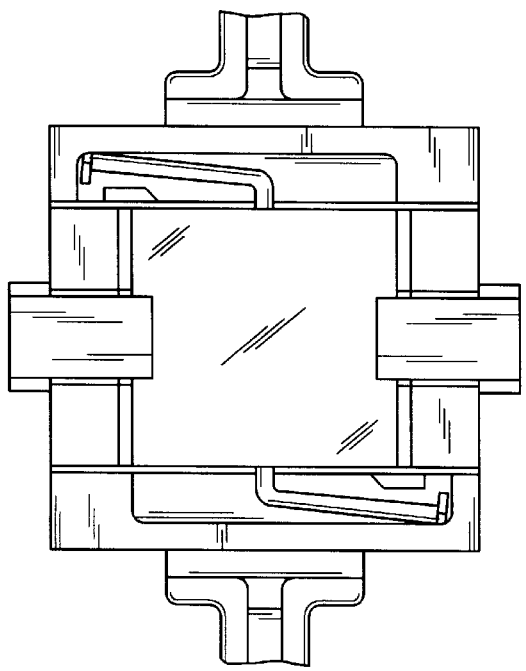
Figure 5C:
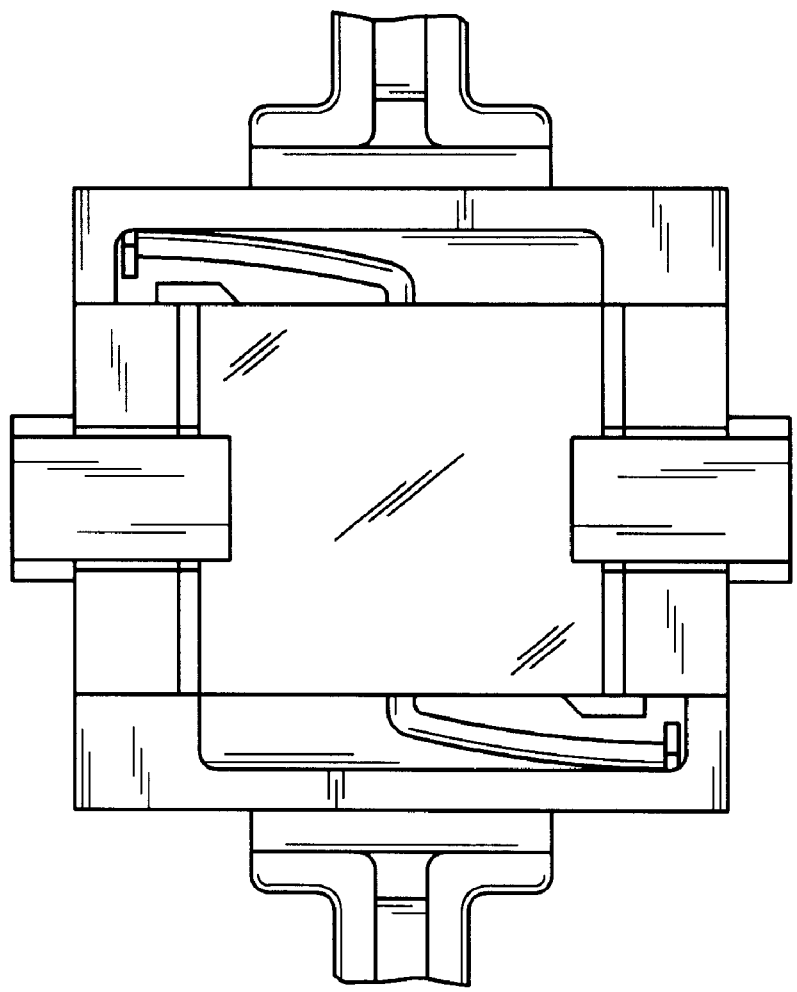

FIGS. 5A, 5B and 5C are a series of bottom views of the compression tool 10 of the invention. As shown, the first set of jaws 410 is already closed on the heat sink 108 to support compression of the torsional spring in the vertical direction. Each member of the second set of jaws 420 has a respective extremity having a respective trough wall 429 for engaging a respective opposing extremity 122, 124 of the torsional spring, and for compressing the torsional spring in the horizontal direction. Progressing through the series of bottom views, FIGS. 5A, 5B and 5C illustrate the second set of jaws 420 closing to compress the torsional spring in the horizontal direction.

As discussed, the present invention provides an efficient and compact tool for compressing the torsional spring for clamping the heat sink. Although specific embodiments of the invention have been described and illustrated, the invention is not to be limited to the specific forms or arrangements of parts so described and illustrated, and various modifications and changes can be made without departing from the scope and spirit of the invention. Within the scope of the appended claims, therefor, the invention may be practiced otherwise than as specifically described and illustrated.

What is claimed is:
1. An apparatus comprising:
   a tool for compressing a torsional spring for clamping a heat sink including:
      a base having an aperture extending therein for receiving the torsional spring and the heat sink;
      a first set of opposing jaws pivotally coupled with the base for compressing the torsional spring in a vertical direction; and
      a second set of opposing jaws pivotally coupled with the base for compressing the torsional spring in a horizontal direction.

2. An apparatus as in claim 1 wherein the first set of jaws is arranged orthogonal to the second set of jaws.

3. An apparatus as in claim 1 wherein:
   each member of the first set of jaws has a respective L shaped extremity for engaging and retaining the heat sink, which in turn engages a central region of the torsional spring so as to support compressing the torsional spring in the vertical direction; and
   each member of the second set of jaws has a respective jaw extremity having a respective trough floor for engaging a respective opposing extremity of the torsional spring, so as to further support compressing the torsional spring in the vertical direction.

4. An apparatus as in claim 1 wherein the respective jaw extremity of each member of the second set of jaws has a respective vertical post extending from the trough floor for retaining the extremity of the torsional spring as the trough floor supports compressing the torsional spring in the vertical direction.

5. An apparatus as in claim 1 wherein each member of the second set of jaws has a respective extremity having a respective trough wall for engaging a respective opposing extremity of the torsional spring, and for compressing the torsional spring in the horizontal direction.

6. An apparatus as in claim 1 further comprising a locking pliers coupled with the second set of jaws for controlling the second set of jaws.

7. An apparatus as in claim 1 wherein extremities of the first set of jaws are sufficiently short so that the extremities of the torsional spring extend beyond the extremities of the first set of jaws when the torsional spring and the heat sink are disposed in the aperture of the base.

8. An apparatus as in claim 1 wherein extremities of the second set of jaws are sufficiently short so that the extremities of the torsional spring extend beyond the extremities of the second set of jaws when the torsional spring and the heat sink are disposed in the aperture of the base.

9. An apparatus comprising:
   a tool for compressing a torsional spring for clamping a heat sink including:
      a base having an aperture extending therein for receiving the torsional spring and the heat sink;
      means coupled with the base for compressing the torsional spring in a vertical direction; and
      means coupled with the base for compressing the torsional spring in a horizontal direction.

* * * * *